United States Patent [19]

Kuwahara

[11] Patent Number: 4,752,887
[45] Date of Patent: Jun. 21, 1988

[54] ROUTING METHOD FOR USE IN WIRING DESIGN

[75] Inventor: Norio Kuwahara, Tokyo, Japan

[73] Assignee: NEC Corporation, Tokyo, Japan

[21] Appl. No.: 835,238

[22] Filed: Mar. 3, 1986

[30] Foreign Application Priority Data

Mar. 1, 1985 [JP] Japan .................................. 60-38835

[51] Int. Cl.[4] .............................................. G06F 15/20
[52] U.S. Cl. .................................... 364/491; 364/489; 364/488
[58] Field of Search ............... 364/488, 489, 490, 491; 361/400, 409, 428; 307/303; 174/68.5; 29/846

[56] References Cited

U.S. PATENT DOCUMENTS

| | | | |
|---|---|---|---|
| 3,944,719 | 3/1976 | Rubey | 361/332 |
| 4,484,292 | 11/1984 | Hong et al. | 364/491 |
| 4,593,351 | 6/1986 | Hong et al. | 364/200 |
| 4,615,011 | 9/1986 | Linsker | 364/491 |
| 4,636,965 | 1/1987 | Smith et al. | 364/489 |

FOREIGN PATENT DOCUMENTS

| | | | |
|---|---|---|---|
| 0189471 | 10/1984 | Japan | 364/489 |
| 0008982 | 1/1985 | Japan | 364/489 |

OTHER PUBLICATIONS

Hu et al., "VLSI Circuit Layout: Theory and Design", IEEE Press, 1985, pp. 3–18.
Breuer, M. A., "Design Automation of Digital Systems, vol. 1, Theory and Techniques", Prentice-Hall, Englewood Cliffs, N.J., pp. 314–326 (1972).
Breuer, et al, "A Hardware Router", Journal of Digital Systems, vol. IV, issue 4, pp. 393–408 (1981).
Blank, et al, "A Parallel Bit Map Processor Architecture for DA Algorithms", 18th Design Automation Conference Proceedings, pp. 837–845 (1981).
Mikami, et al, "A Computer Program for Optimal Routing of Printed Circuit Conductors", 1968 IFIP Cong., pp. 1475–1478 (1968).
Lee, C. Y., "An Algorithm for Path Connections and its Applications", IRE Transactions on Electronic Computers, vol. EC-10, No. 3, pp. 346–365 (1961).
Geyer, J. M., "Connection Routing Algorithm for Printed Circuit Boards", IEEE Transations on Circuit Theory, vol. CT-18, No. 1, pp. 95–100, Jan. 1971.

*Primary Examiner*—Parshotam S. Lall
*Assistant Examiner*—V. N. Trans
*Attorney, Agent, or Firm*—Foley & Lardner, Schwartz, Jeffery, Schwaab, Mack, Blumenthal & Evans

[57] ABSTRACT

A method for automatically designing the route of the wiring on printed wiring boards, large scale integrated circuit (LSI) chips or the like which can be used to create the wiring design of wiring boards or the like having a plurality of different wiring pattern densities.

2 Claims, 6 Drawing Sheets

ROUTING METHOD FOR USE IN WIRING DESIGN

BACKGROUND OF THE INVENTION

The present invention relates to a routing method for use in automatically designing the wiring of printed wiring boards, large scale integrated circuit (LSI) chips or the like.

An example of conventional routing methods used for an automatic wiring design in computer aided design (CAD) systems or the like is disclosed on pages 312 to 326 of the publication titled "Design Automation of Digital Systems, Vol. 1, Theory and Techniques" by M. A. Breuer, published in 1972 by Prentice-Hall, Inc. (Reference 1). In the prior art method, a plurality of connection points (grid cells) are arrayed on a plane on which wiring is to be achieved. A path for connecting two designated connection points, i.e., a wiring path, is expressed by the positions of a series of empty cells (each connectable to all other adjacent empty cells) through which this path passes. These cells can be further defined as obstacle cells, which are prohibited from connection with all other adjacent cells. In such a prior art method, however, only the above-mentioned obstacle cells and empty cells can be defined, so that the density of the wiring pattern achievable on the above-mentioned plane becomes uniform on the whole plane. In other words, the method does not allow a region having a different wiring pattern density to be defined on that plane, as will be described later. As a result, it is difficult to apply this method to the wiring design of wiring boards or the like having a plurality of regions of different wiring pattern desities.

An object of the present invention is, therefore, to provide a routing method free from the above-mentioned disadvantage.

SUMMARY OF THE INVENTION

According to an aspect of the invention, there is provided a routing method using memory means having a plurality of memory locations corresponding to a plurality of connection points defined on a plane on which wiring is to be achieved, input means, and processing means for executing the routing method. The routing method comprises:

a routing method using memory means having a plurality of memory locations corresponding to a plurality of connection points defined on a plane on which wiring is to be achieved, input means, and processing means for executing the routing method, the routing method comprising:

memorizing first state information indicative of the permission of connection of said connection points with adjacent connection points, into all of said memory locations:

memorizing second state information indicative of the prohibition of connection of said connection points with adjacent connection points, into one or more of said memory locations corresponding to one or more of said connection points designated by first obstacle information given from said input means;

memorizing third state information indicative of the prohibition of connection of said connection points with an adjacent connection point or points designated by second obstacle information given from said input means, into one or more of said memory locations corresponding to one or more of said connection points designated by the second obstacle information given from said input means; and finding, taking into account the permission or prohibition of connection between said connection points depending on the contents of said memory means, a path linking two of said connection points designated by section information given from said input means.

BRIEF DESCRIPTION OF THE DRAWINGS

The features and advantages of the present invention will become apparent from the following description when taken in conjunction with the accompanying drawings, wherein.

In the drawings, the same reference numerals represent the same structural elements, respectively.

DETAILED DESCRIPTION OF A PREFERRED EMBODIMENT

Figure 1:
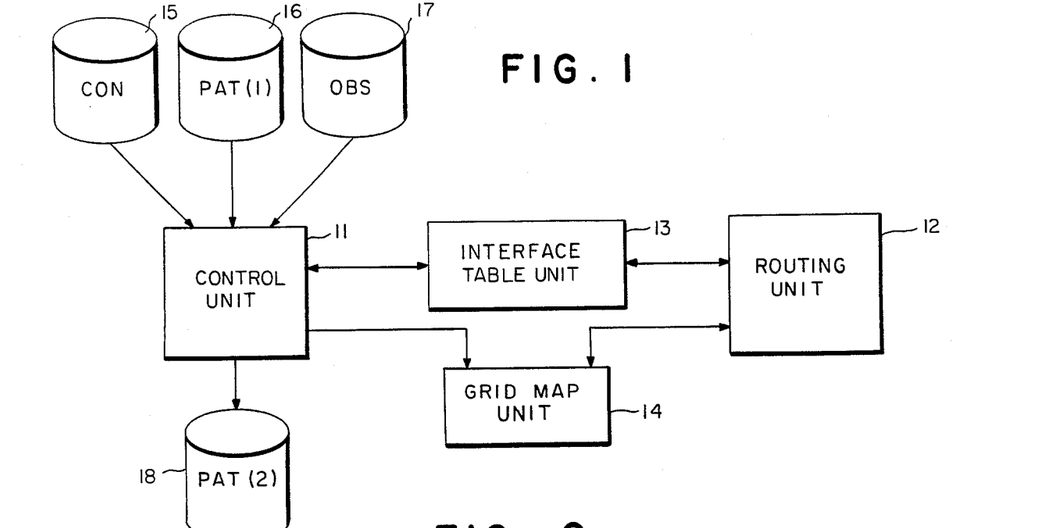
FIG. 1 is a block diagram of a preferred embodiment of the invention.

Referring to FIG. 1, a preferred embodiment of the present invention comprises a control unit 11; a routing unit 12 for finding a wiring path between two grid points; an interface table unit 13 referred to by the control unit 11 and the routing unit 12; a grid map unit 14 for memorizing states of all grid points; a section data file CON 15 in which are stored section data signals indicating sections to be wire-connected; a wired path data file PAT(1) 16 in which are stored wired path data signals indicating paths already laid out; an obstacle data file OBS 17 in which are stored obstacle data signals indicating obstacles; and a wired path data output file PAT(2) 18 in which are stored wired path data signals indicative of paths detected by the units 11 and 12.

The control unit 11 and the routing unit 12 can be realized either with a program operating on a well-known general purpose computer or with specialized hardware. An example of the latter is disclosed in a paper entitled "A Hardware Router" by M. A. Breuer et al., published in the JOURNAL OF DIGITAL SYSTEMS, Vol. IV, issue 4, pages 393 to 408, 1981 (Reference 2). Another example is disclosed in a paper entitled "A Parallel Bit Map Processor Architecture for DA Algorithms" by T. Blank et al., published in the Proceedings 18th Design Automation Conference, pages 837 to 845, 1981 (Reference 3). The table unit 13 and the map unit 14 are arranged in predetermined memory areas on a memory unit in a computer system. Description hereunder is made for an instance in which the control unit 11 and the routing unit 12 are realized with a program operating on a computer system.

Figure 2:
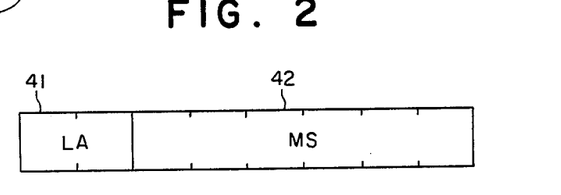
FIG. 2 is a diagram of a format of a grid point data signal.

FIG. 2 shows a format for a grid point data (GPD) signal representing a state of a grid point. Herein, the GPD signal consists of eight bits. A two-bit state field LA 41 of the GPD signal is used for indicating the state of the grid point, and can represent one of the following four possible states.

(1) In response to the field LA containing a binary code "00" (hereinunder abbreviated as "00"), paths running via this grid point in all directions can be formed.

(2) In response to the field LA containing a binary code "01" (hereinunder abbreviated as "01"), which is called a x track prohibition code, a path running via this grid point in a x direction cannot be formed.

(3) In response to the field LA containing a binary code "10" (hereinunder abbreviated as "10"), which is called a y track prohibition code, a path running via this grid point in a y direction normal to the x direction cannot be formed.

(4) In response to the field LA containing a binary code "11" (hereinunder abbreviated as "11"), no path running via this grid point can be formed.

A six-bit marking field MS 42 of the GPD signal is a part that can be freely used in a labeling process and in other useful processes.

Now, description will be made in detail on the processing within control unit 11 with reference to FIG. 3. It is assumed that a substrate to be wired has a single wiring layer and that grid points to be used for routing are arranged in 10 lines by 10 rows. Each grid point is identified as g(m, n), where m (=1 to 10) and n (=1 to 10) represent the m-th line and the n-th row, respectively, on which it is positioned. A pair of the m and n for each grid point is called "grid point positional information". The grid map unit 14 is realized in a predetermined memory area, referred to as a map area, on the memory unit. The map area may be assigned from a first memory location represented by a byte address A to a second memory location represented by a byte address (A+99). Eight bits are assigned to each memory location. The GPD signal of the grid point g(m, n) is stored in the memory location designated by a byte address $\{A+(m-1)\times 10+(n-1)\}$.

Figure 3:
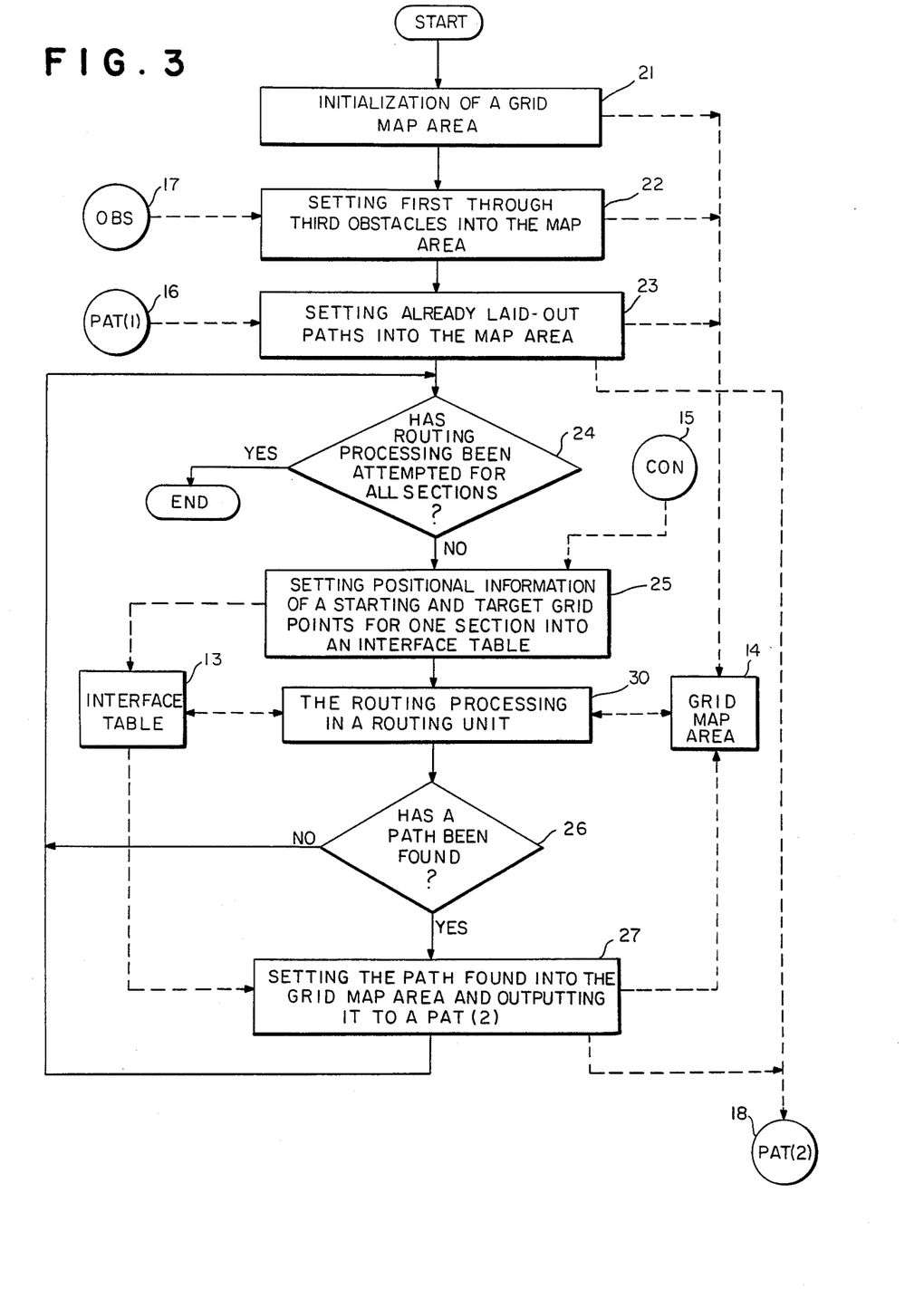
FIG. 3 is a flow chart of a method of processing for use in a control unit 11.

In FIG. 3, solid arrows indicate the processing flow, and broken arrows, the data flow. The control unit 11, at a processing step 21, first clears to zero every bit of every memory location in the map area on the memory unit. Then, at a processing step 22, the unit 11 reads from the file OBS 17 component pin data signals, wiring prohibition data signals, x track prohibition data signals, y track prohibition data signals and so forth. The component pin data signals include the grid point positional information of the grid points, respectively, at which pins the components must be provided. According to the positional information of each pin data signal, that is, m and n, the address $\{A+(m-1)\times 10+(n-1)\}$ is calculated, by which a corresponding GPD signal in the map area is designated to set "11" into the field LA 41 of the designated GPD signal. Each wiring prohibition data signal includes the above-mentioned positional information, and "11" is similarly set into the field LA 41 of each designated GPD signal. Each x track prohibition data signal includes the above-mentioned positional information, and "01" is set into the field LA 41 of each GPD signal designated by the positional information. Each y track prohibition data signal includes the above-mentioned positional information, and "10" is set into the field LA 41 of each GPD signal designated by the positional information. Herein, the grid point corresponding to a GPD signal whose field LA assumes "11" functions as a first obstacle, which cannot be connected to any of the other grid points. The grid point corresponding to a GPD signal whose field LA assumes "01" functions as a second obstacle. The second obstacle is connectable to only the two grid points more adjacent to the second obstacle than the other grid points lying on the same row (running in the y direction) as the second obstacle lies. The grid point corresponding to a GPD signal whose field LA assumes "10" functions as a third obstacle. The third obstacle is connectable to only the two grid points more adjacent to the third obstacle than the other grid points lying on the same line (running in the x direction) as the third obstacle lies.

Further, a grid point may be defined as a fourth obstacle connectable to other grid point or points which are adjacent to the fourth obstacle and do not lie on the same line and the same row as the fourth obstacle lies. However, for the sake of simplicity, the following description will be made for a case in which only the first through third obstacles are used.

Referring to FIG. 3 again, the wired path data signal or signals are entered from the file PAT(1) 16 at a processing step 23. The wired path data signals indicate the paths which are desired to be secured in advance as a wiring area. Each wired path data signal includes the grid point positional information of a plurality of grid points lying on a path. "11" is set into the field LA 41 of each of the GPD signals in the map area, which are designated by the positional information included in each wired path data signal. At the step 23, if there is no wired path data signal, the processing is immediately handed over to a decision step 24. At the step 24, it is decided whether or not the routing processing has been attempted for all the section data signals, and the entire routing processing will end when it has been attempted for all the section data signals. If the file CON 15 has at least one section data signal for which the routing processing has not yet been attempted, the field MS of each GPD signal is cleared to zero. Then, one section data signal for one section including the grid point positional information of a starting grid point and that of a target grid point is entered from the file CON 15 at a processing step 25, and is set into the interface table unit 13. At a processing step 30, the control is delivered to the routing unit 12. This routing unit 12, as will be described later in detail, searches for a wiring path for the section data signal supplied via the interface table unit 13 while evading the obstacles with reference to the GPD signals in the map area. When the wiring path has been found, the unit 12 stores the wired path data signal corresponding to the wiring path into the interface table unit 13.

Main routing algorithms include the maze method and the line search method. The methods are disclosed in a paper entitled "A Computer Program for Optimal Routing of Printed Circuit Conductors", by K. Mikami et al., published in the IFIP Cong. '68, pages 1475 to 1478, 1968 (Reference 4). The former method will be outlined later on.

At a decision step 26, it is judged by examining a result flag whether or not the routing unit 12 has found a wiring path, and the sequence will, if it has, move ahead to a processing step 27, or, if not, return to the step 24.

At the processing step 27, the path indicated by the wired path data signal stored in the interface table unit 13 is set into the map area as obstacles which will be used in the subsequent routing processing, and at the same time are outputted to the file PAT(2) 18 as the resulting path found for one section.

Next will be described, with reference to FIGS. 4A to 4C, the maze method disclosed in a paper "An Algorithm for Path Connections and Its Applications" by C. Y. Lee, published in the IRE Transactions on Electronic Computers, Vol. EC-10, No. 3, 1961, pages 346 to 365 (Reference 5), which is a typical routing algorithm for use in the routing unit 12 shown in FIG. 1.

Figure 4A:
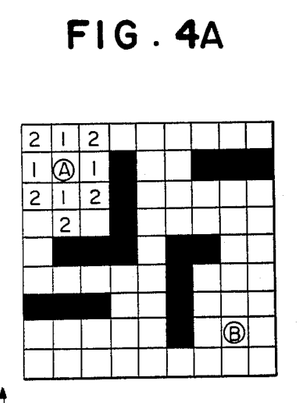
FIGS. 4A to 4C are diagrams for illustrating how a maze pattern is formed.

Now it is supposed that the positional information of a starting grid point A31 and a target grid point B32 shown in FIG. 4A is supplied as a section data signal via the interface table unit 13 at the step 25 of FIG. 3. It is also supposed that the grid points marked in black in FIGS. 4A to 4C are the obstacles. First, a "1" is labeled at each of the grid points immediately adjacent to the grid point A31. Next, a "2" is labeled at each of the grid points adjacent to the grid points where the "1"'s are labeled (FIG. 4A). Then, a "3" is set at each of the grid points adjacent to the grid points where the "2"'s are labeled. This procedure is repeated until either of the following two states is achieved.

(1) At the k-th step, there is no unlabeled grid point adjacent to the grid points at which "(k−1)"'s are labeled, i.e. all the grid points are blocked.

Figure 4B:
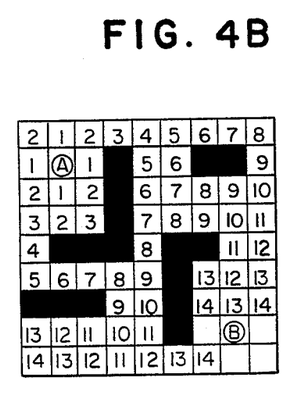
Figure 4C:
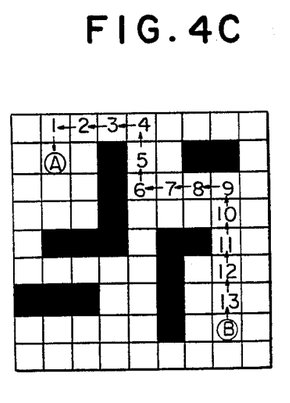

(2) The target grid point B32 is reached (FIG. 4B).

In FIG. 4B, the grid point B32 is reached at the 14-th step. Therefore, there must be at least one grid point which is immediately adjacent to the grid point B32 and at which a "13" is labeled. Further, any grid point at which this "13" is labeled must also be adjacent to at least one grid point at which a "12" is labeled. Proceeding in this way would readily reveal a path to return to the grid point A31. This basic routing algorithm for single layer use can be expanded into the routing algorithm for multilayer use disclosed in a paper entitled "Connection Routing Algorithm for Printed Circuit Boards" by J. M. Geyer published in the IEEE Transactions on Circuit Theory, Vol. C-18, January, 1971 (Reference 6).

Figures 5A, 5B:
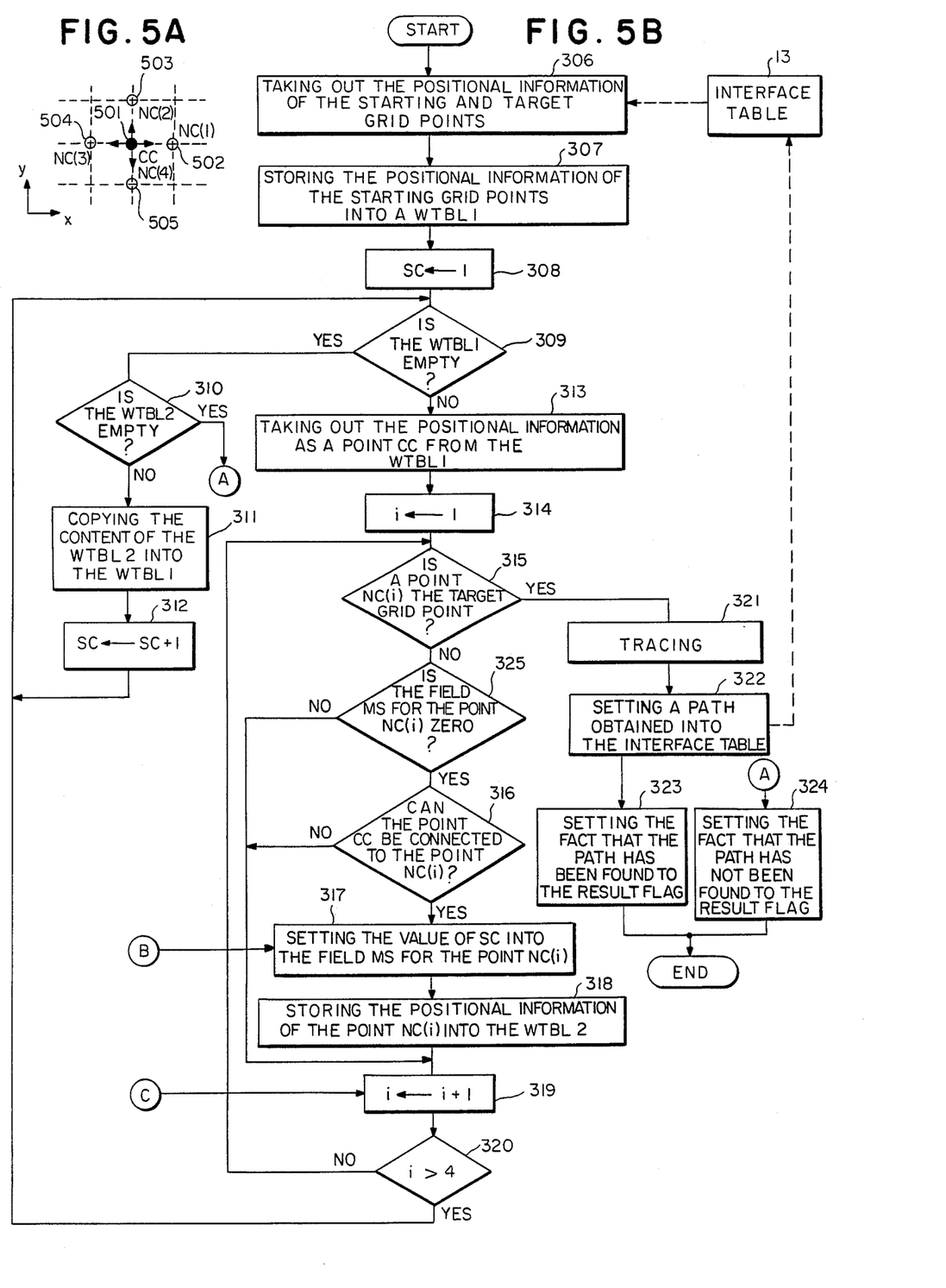
FIG. 5A is a diagram showing a grid point and other grid points adjacent thereto.
FIGS. 5B and 5C are flow charts of a method of processing for use in a routing unit 12.
Figure 5C:
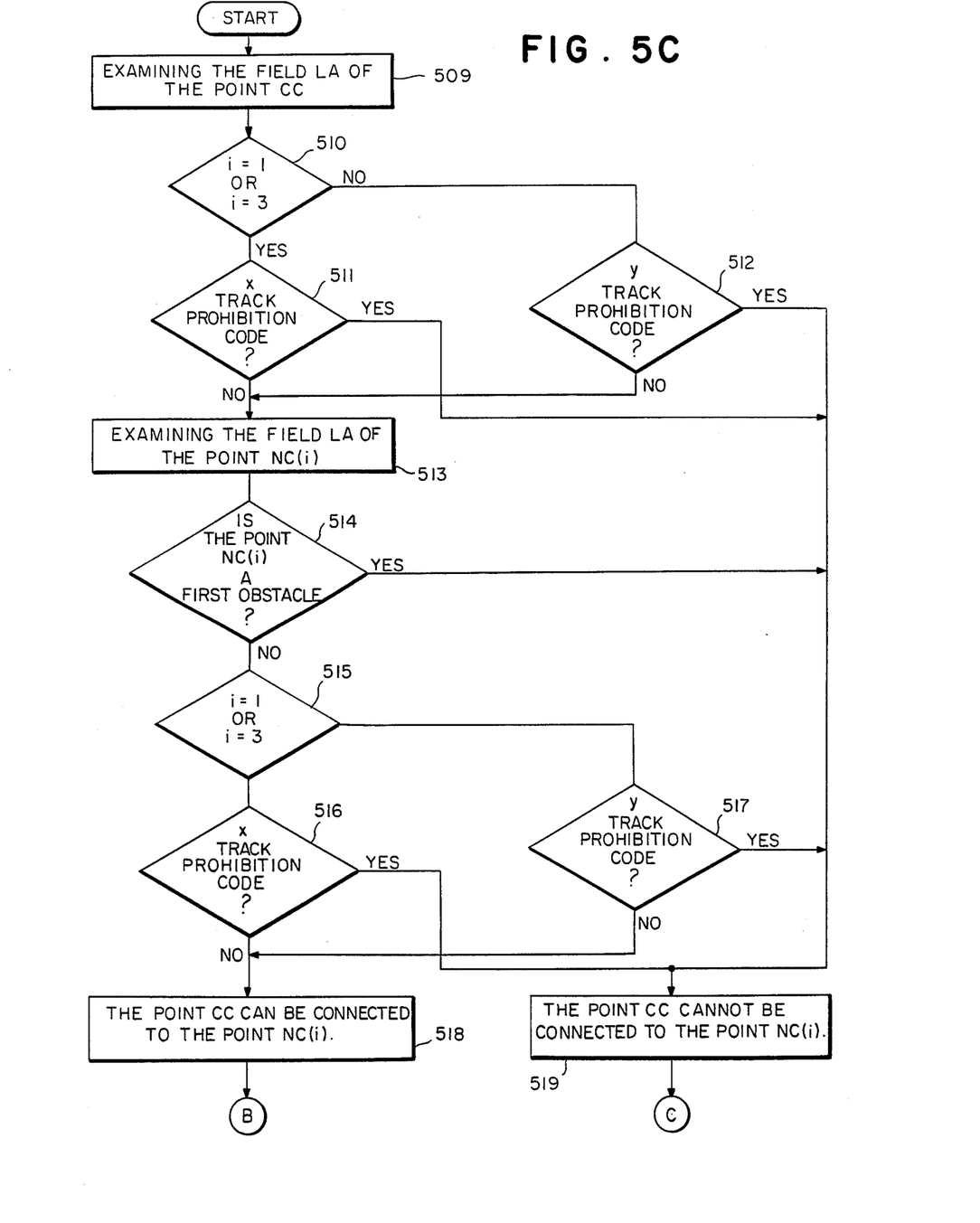

Referring now to FIGS. 5A, 5B and 5C, description will be made on the routing process including a labeling process for the formation of such a maze pattern as shown in FIG. 4B, in accordance with the present invention.

FIG. 5A shows an origin grid point CC 501 now under consideration, and adjacent grid points NC(i) {i=1 to 4} 502 to 505 immediately adjacent to the CC 501. As is apparent from the figure, a variable i represents the direction corresponding to its value; when the variable i assumes values of 1, 2, 3 and 4, the rightward, upward, leftward and downward directions are indicated, respectively.

Referring to FIG. 5B, the routing unit 12, having taken over the control from the control unit 11 at the step 30 of FIG. 3, first takes out of the table unit 13 at a processing step 306 the positional information of the starting grid point A31 (FIG. 4A), and at a processing step 307 stores the positional information into a work table WTBL 1. The WTBL 1 may be provided within the memory unit to store the positional information of the grid points, each of which serves as a origin for the search at each step.

Next, at a processing step 308, the value is set into a step counter SC. Then, at the decision step 309 whether or not any positional information is stored in the WTBL 1 is judged and, if none is, the flow is branched to a decision step 310. At the step 310, whether or not any positional information is stored in a work table WTBL 2 is judged. The WTBL 2 is for storing the positional information of all the grid points connectable to each grid point stored in the WTBL 1. If no positional information is stored in the WTBL 2, the flow is branched to a processing step 324, and the fact of failing to find a path is set in the result flag to complete the routing processing. This means that the routing has come to a deadlock. If any positional information is stored in the WTBL 2, after all the positional information are copied from the WTBL 2 into the WTBL 1 at a processing step 311, the step counter SC is counted up by one at a processing step 312 to branch the flow to the decision step 309.

If any positional information is stored in the WTBL 1, the positional information of one grid point is taken out of it at a processing step 313, and this grid point is regarded as the origin grid point CC 501 (see FIG. 5A). The positional information taken out is eliminated from the WTBL 1. Then, at a processing step 314, a variable i is set at a value of one.

Next, at a decision step 315, it is judged whether the positional information of the adjacent grid point NC(1) (i=1) 502 adjacent to the point CC 501 coincides with that of the target grid point B32. If this judgement is affirmative, a path is traced from the target grid point to the starting grid point at a processing step 321, and then a wired path data signal thereby obtained is set in the interface table at a processing step 322. Then, the fact of the discovery of the path is set to the result flag at a processing step 323 to complete the routing processing.

If the judgement is negative at the step 315, it is judged by examining the map area at a decision step 325 whether or not the field MS of the GPD signal of the point NC(1) is zero, and the flow will go to a step 319 if it is not zero or to a step 316 if it is. At the step 316, it is decided whether or not the point CC 501 can be connected to the point NC(1). This decision will be described in detail later with reference to FIG. 5C.

If the point CC 501 can be connected to the point NC(1), the value of the step counter SC is set into the field MS of the grid point data signal of the point NC(1) at a processing step 317, and at a processing step 318 the positional information of the grid point NC(1) is stored into the WTBL 2. If the decision is negative at the step 316, the flow will be branched to the processing step 319 at which step the value of the variable i is counted up by one and, at a decision step 320, it is judged whether or not the value of the variable i is more than four. The flow will be branched to the decision step 309 if it is or to the step 315 if it is not.

In the embodiment, the values of the labels given to the present grid points increase as the labeling process proceeds. However, it is possible to trace a path from a target grid point to a starting one if each label has its preceding label different from its succeeding label. This labeling sequence is typically illustrated in FIG. 6–34 at page 318 of the above Reference 1. This sequence contributes to a great decrease in memory capacity, because the field MS of a GPD signal need not be more than two bits in this case.

Next, description will be made in detail on the processing for deciding whether or not the origin grid point CC 501 can be connected to the adjacent grid points NC(i) {i=1 to 4} 502 to 505 (the processing at the step 316 of FIG. 5B), with reference to FIG. 5C. Here, it is assumed that the value of the variable i is one.

First, at a processing step 509, the content of the field LA 41 of the GPD signal corresponding to the grid point CC 501 is examined with reference to the map area. Then, since the value of the variable i equals one, the flow reaches a decision step 511 via a decision step 510. At the step 511, if "01", that is, the x track prohibition code is stored in the field LA 41 of the grid point data signal of the grid point CC 501, the flow is branched to a step 519 to go to the step 319 of FIG. 5B, resulting in the decision that it is impossible to connect the grid point CC 501 to the adjacent grid point NC(1) 502. Such a situation arises, when at the current step the grid point NC(1) 502 intends to be connected to the grid point CC 501. After this step the adjacent grid point NC(2) 503 or NC(4) 505 is connected to the grid point CC 501. One the other hand, where the content of the field LA 41 is "00" or "10", the flow goes to a processing step 513 at which the content of the field LA 41 of the grid point NC(1) 502 is examined referring to the map area, and then goes to a decision step 514. If the field LA 41 of the point NC(1) 502 indicates "11", the flow is branched to the step 519. On the other hand, where the content of the field LA 41 of the grid point. NC(1) 502 is not "11", the flow goes to a decision step 516 via a decision step 515. At the step 516, if "01", that is, the x track prohibition code is set in the field LA 41 of the GPD signal of the grid point NC(1) 502, the flow is branched to the step 519. On the other hand, where the content of the field LA 41 of the grid point NC(1) 502 is not "01", the flow goes to a decision step 518 to go to the step 317 of FIG. 5B, resulting in the decision that it is possible to connect the grid point CC 501 to the grid point NC(1) 502. Although the description was made only as to the decision of whether or not the point CC 501 can be connected to the point NC(1) 502, similar can also be made with respect to the other grid points NC(2) 503, NC(3) 504 and NC(4) 505.

Figure 6A:
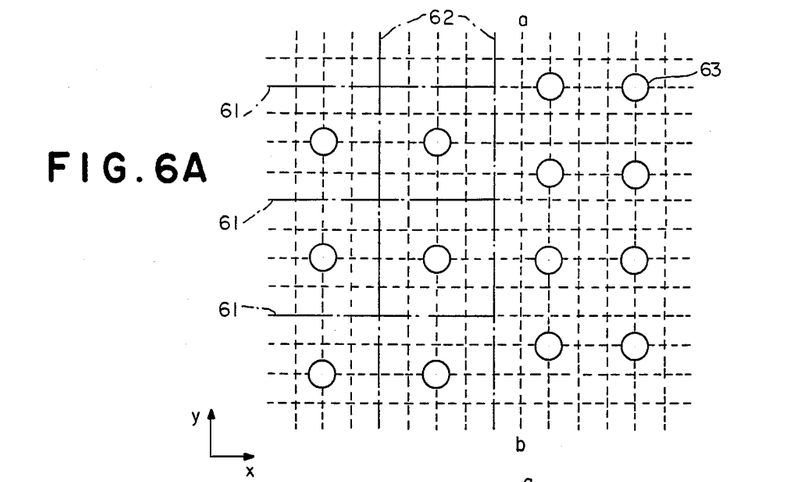
FIGS. 6A, 6B, 7A, 7B, 8A and 8B are diagrams of examples of substrates in which regions having different wiring pattern densities coexist.
Figure 6B:
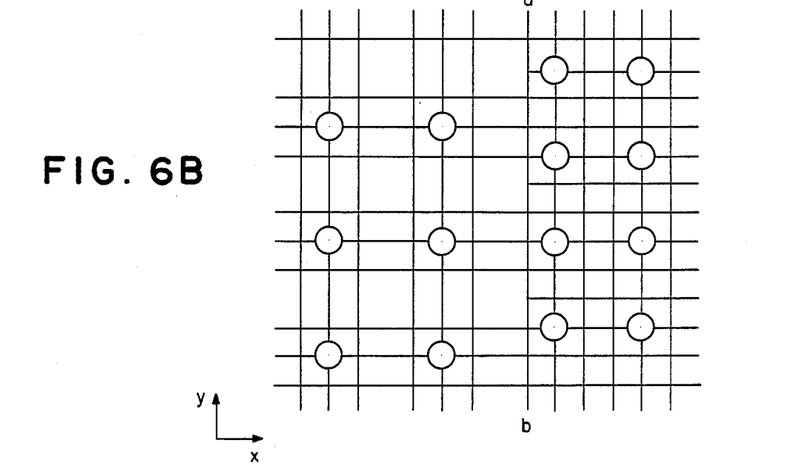

FIGS. 6A and 6B illustrates a first example of a first substrate or board designed by the use of the invention. In FIG. 6A, dotted lines indicate a wiring grid having intersections, that is, grid points. Pins 63 are provided at some grid points. In the left side region of a segment a-b, three wires can be allowed to pass between adjacent pins, respectively. In the right side region of the segment a-b, two wires can be allowed to pass between adjacent pins, respectively. However, in a case where, as shown in FIG. 6B, the number of wires that can pass between adjacent pins should be limited to two even in the left side region on account of large land diameters of the pins, the problem can be solved according to the wire routing method of the present invention by setting the x track prohibition code into the grid point data signals of the grid points lying on lines 61 in FIG. 6A and the y track prohibition code into the grid point data signals of the grid points lying on lines 62. Namely, only solid lines shown in FIG. 6B are considered to find a wiring path in the routing process. In this manner, even a substrate on which the wiring pattern density differs from region to region can be readily designed.

Figure 7A:
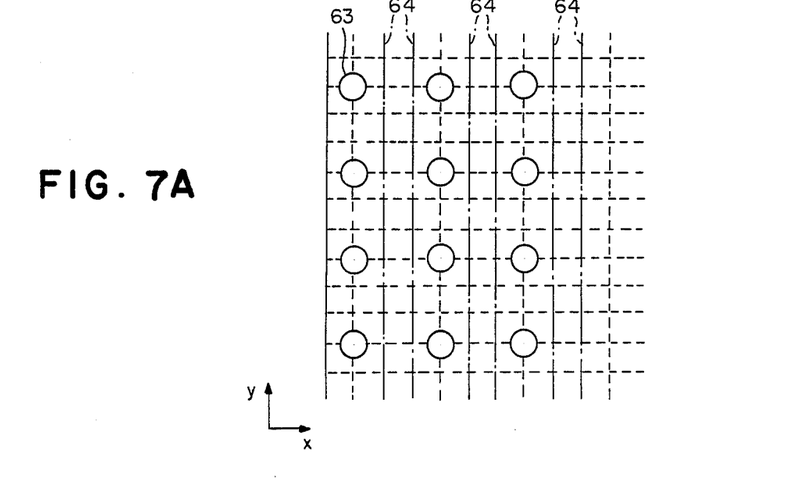
Figure 7B:
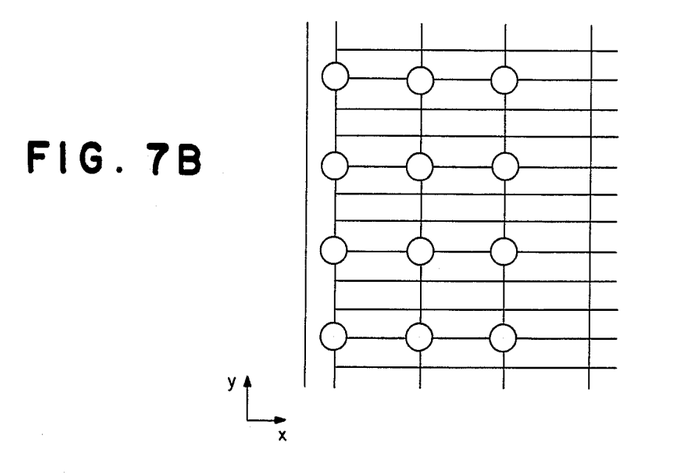

Further, the wire routing method of the present invention can as well be applied to the design of a second substrate or board on which the interval of wires laid out in the x direction differs from the interval of wires laid out in the y direction, as shown in FIG. 7B, by setting the y track prohibition code into the grid point data signals of the grid points lying on lines 64 shown in FIG. 7A.

Figure 8A:
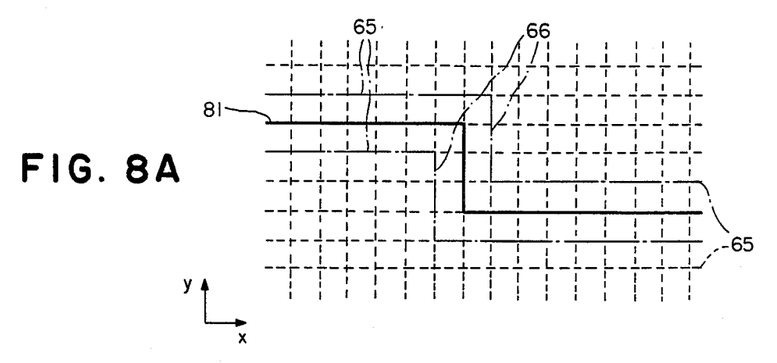
Figure 8B:
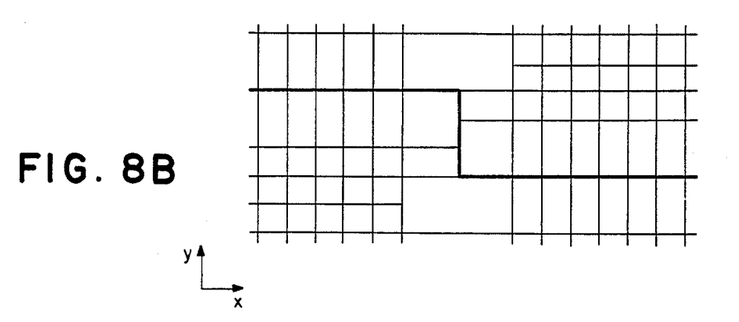

Moreover, as illustrated in FIG. 8A, the running of wires adjacent to wires 81 already laid out can be prohibited by setting the x track prohibition code and the y track prohibition code into the grid point data signals of the grid points lying on lines 65 and 66 adjacent to the wire 81 and, furthermore, in the wiring of sections belonging to the same net, as shown in FIG. 8B, there remain grid points reaching the already wired segments 81, so that it is possible to branch wiring therefrom.

Although the maze method is used as the routing algorithm in this preferred embodiment, some other algorithm, such as the previously mentioned line search method, may as well be used.

While this invention has been described in conjunction with the preferred embodiment thereof, it will now readily be possible for those skilled in the art to put this invention into practice in various other manners.

What is claimed is:

1. A routing method using memory means, input means and processing means for executing the routing method, said memory means having a plurality of memory locations corresponding to a plurality of connection points defined on a plane on which wiring is to be achieved, the routing method comprising the steps of:
   (a) memorizing first state information indicative of the permission of connection of each of said connection points with all adjacent connection points, into all of said memory locations;
   (b) memorizing second state information indicative of the prohibition of connection of each of said connection points desgnated by first obstacle information with all adjacent connection points, into one or more of said memory locations corresponding to one or more of said connection points designated by said first obstacle information give from said input means;
   (c) memorizing third state information indicative of the prohibition of connection of each of said connection points designated by second obstacle information with an adjacent connection point or points only in a predetermined direction, said predetermined direction designated by said second obstacle information given from said input means, into one or more of said memory locations corresponding to one or more of said connection points designated by the second obstacle information given from said input means; and
   (d) finding, taking into account the permission or prohibition of connection between said connection points depending on the contents of said memory means, a path linking two of said connection points designated by section information given from said input means.

2. The routing method as recited in claim 1 wherein said step (C) includes memorizing said third state information wherein said second obstacle information designates a first direction as said predetermined direction and said method further includes the step of: memorizing additional third state information indicative of the prohibition of connection of each of said connection points designated by third obstacle information with an adjacent point or points only in a second direction, perpendicular to said first direction, said second direction specified by said third obstacle information.

* * * * *